(12) United States Patent
Tsuda

(10) Patent No.: US 8,228,158 B2
(45) Date of Patent: Jul. 24, 2012

(54) SEMICONDUCTOR DEVICE

(75) Inventor: Hiroshi Tsuda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 495 days.

(21) Appl. No.: 12/382,678

(22) Filed: Mar. 20, 2009

(65) Prior Publication Data
US 2009/0251275 A1 Oct. 8, 2009

(30) Foreign Application Priority Data
Apr. 3, 2008 (JP) ................................. 2008-096918

(51) Int. Cl.
*H01H 85/04* (2006.01)
*H01L 23/52* (2006.01)
*H01L 23/62* (2006.01)
*H01L 21/82* (2006.01)
*H01L 21/44* (2006.01)

(52) U.S. Cl. ........ 337/292; 257/529; 257/665; 257/209; 438/601; 438/132; 337/297

(58) Field of Classification Search .................. 337/290, 337/292, 297; 257/529, 665, 209; 438/601, 438/132
See application file for complete search history.

(56) References Cited

U.S. PATENT DOCUMENTS

| 5,427,979 | A | * | 6/1995 | Chang | 438/600 |
| 5,618,750 | A | * | 4/1997 | Fukuhara et al. | 438/601 |
| 5,760,674 | A | * | 6/1998 | Gilmour et al. | 337/297 |
| 5,879,982 | A | * | 3/1999 | Park et al. | 438/241 |
| 5,907,788 | A | * | 5/1999 | Kasai | 438/622 |
| 6,033,939 | A | * | 3/2000 | Agarwala et al. | 438/132 |
| 6,078,088 | A | * | 6/2000 | Buynoski | 257/410 |
| 6,100,118 | A | * | 8/2000 | Shih et al. | 438/132 |
| 6,133,628 | A | * | 10/2000 | Dawson | 257/698 |

(Continued)

FOREIGN PATENT DOCUMENTS
JP 2005-057186 3/2005
(Continued)

OTHER PUBLICATIONS

Takaoka, et al., "A Novel Via-fuse Technology Featuring Highly Stable Blow Operation with Large On-off Ratio for 32nm Node and Beyond", Electron Devices Meeting, 2007. IEDM 2007. IEEE International, Issue Date: Dec. 10-12, 2007, pp. 43-46.

(Continued)

*Primary Examiner* — Bradley Thomas
(74) *Attorney, Agent, or Firm* — McGinn IP Law Group, PLLC

(57) ABSTRACT

A semiconductor device has a semiconductor substrate and a first electrical fuse and a second electrical fuse, which are provided on the semiconductor substrate. The first electrical fuse has a first upper layer wire and a first lower layer wire formed in different wire layers, and a via for connecting the first upper layer wire to the first lower layer wire. The second electrical fuse has a second upper layer wire and a second lower layer wire formed in different wire layers, and a via for connecting the second upper layer wire to the second lower layer wire. The semiconductor device has a connection portion for connecting the above described first upper layer wire of the first electrical fuse to the second lower layer wire of the second electrical fuse. The connection portion connects the first electrical fuse and the second electrical fuse in series.

20 Claims, 6 Drawing Sheets

U.S. PATENT DOCUMENTS

| | | | |
|---|---|---|---|
| 6,162,686 A * | 12/2000 | Huang et al. | 438/281 |
| 6,177,297 B1 * | 1/2001 | Chen et al. | 438/132 |
| 6,180,503 B1 * | 1/2001 | Tzeng et al. | 438/601 |
| 6,218,721 B1 * | 4/2001 | Niwa | 257/529 |
| 6,249,038 B1 * | 6/2001 | Daubenspeck et al. | 257/529 |
| 6,255,715 B1 * | 7/2001 | Liaw | 257/529 |
| 6,288,436 B1 * | 9/2001 | Narayan et al. | 257/529 |
| 6,295,721 B1 * | 10/2001 | Tsai | 29/623 |
| 6,300,232 B1 * | 10/2001 | Satoh | 438/601 |
| 6,300,233 B1 * | 10/2001 | Lee et al. | 438/601 |
| 6,337,517 B1 * | 1/2002 | Ohta et al. | 257/758 |
| 6,440,834 B2 * | 8/2002 | Daubenspeck et al. | 438/601 |
| 6,444,544 B1 * | 9/2002 | Hu et al. | 438/467 |
| 6,448,113 B2 * | 9/2002 | Lee et al. | 438/132 |
| 6,521,971 B2 * | 2/2003 | Tsai | 257/529 |
| 6,573,125 B2 * | 6/2003 | Bae | 438/132 |
| 6,642,135 B2 * | 11/2003 | Kim et al. | 438/601 |
| 6,656,826 B2 * | 12/2003 | Ishimaru | 438/612 |
| 6,713,837 B1 * | 3/2004 | Mori et al. | 257/529 |
| 6,716,679 B2 * | 4/2004 | Bae | 438/132 |
| 6,753,244 B2 * | 6/2004 | Wu et al. | 438/601 |
| 6,822,330 B2 * | 11/2004 | Park et al. | 257/758 |
| 6,835,642 B2 * | 12/2004 | Yang et al. | 438/601 |
| 6,861,755 B2 * | 3/2005 | Hosoda et al. | 257/758 |
| 6,867,441 B1 * | 3/2005 | Yang et al. | 257/209 |
| 6,876,057 B2 * | 4/2005 | Watanabe | 257/529 |
| 7,186,593 B2 * | 3/2007 | Kim | 438/132 |
| 7,282,751 B2 | 10/2007 | Ueda | |
| 7,659,601 B2 * | 2/2010 | Park et al. | 257/529 |
| 7,791,111 B2 * | 9/2010 | Kuroyanagi et al. | 257/209 |
| 2003/0031074 A1 | 2/2003 | Tran et al. | |
| 2004/0053487 A1 * | 3/2004 | Jeng et al. | 438/601 |
| 2004/0219720 A1 * | 11/2004 | Jeng et al. | 438/131 |
| 2005/0029620 A1 | 2/2005 | Ueda | |
| 2005/0098803 A1 * | 5/2005 | Komatsu et al. | 257/232 |
| 2005/0179062 A1 * | 8/2005 | Kajita | 257/209 |
| 2005/0247995 A1 | 11/2005 | Pitts et al. | |
| 2006/0289898 A1 * | 12/2006 | Kono et al. | 257/209 |
| 2007/0007621 A1 * | 1/2007 | Omura et al. | 257/529 |
| 2007/0222029 A1 | 9/2007 | Ueda | |
| 2007/0252238 A1 | 11/2007 | Lin | |
| 2008/0067627 A1 * | 3/2008 | Boeck et al. | 257/529 |
| 2008/0081457 A1 * | 4/2008 | Lin et al. | 438/614 |
| 2008/0122027 A1 | 5/2008 | Ueda | |
| 2009/0236637 A1 * | 9/2009 | Ko et al. | 257/207 |

FOREIGN PATENT DOCUMENTS

| | | |
|---|---|---|
| JP | 2006-253237 | 9/2006 |

OTHER PUBLICATIONS

German Office Action dated Sep. 22, 2010, with English translation.

* cited by examiner

RELATED ART

SEMICONDUCTOR DEVICE

This application is based on Japanese patent application NO. 2008-096918, the content of which is incorporated hereinto by reference.

BACKGROUND

1. Technical Field

The present invention relates to a semiconductor device provided with an electrical fuse.

2. Related Art

Conventional semiconductor devices are known where a fuse is mounted so that a process can be carried out, for example the fuse can be cut to adjust the resistance value or separate a defective element, which is thus replaced with a normal element.

In order to provide a highly reliable semiconductor device where such a process can be carried out, it is necessary for the fuse to be cut without failure. Therefore, the fuse disclosed in Japanese Laid-Open Patent Publication 2005-57186 has been proposed.

As shown in FIG. 5, Japanese Laid-Open Patent Publication 2005-57186 discloses a fuse having a current flow-in terminal 902, a current flow-out terminal 901, a pair of fused via portions 903 and 904, and an electrode pad 905.

When a current flows through the fuse between the current flow-in terminal 902 and the current flow-out terminal 901, either of the pair of fused via portions 903 and 904 is fused.

Thus, a pair of fuses via portions 903 and 904 is provided, so that two regions which may fuse when a current flows are formed so that the fuse can be cut without failure, and it is considered that the reliability of the semiconductor device is high.

Here, in FIG. 5, the symbol 906 indicates a semiconductor substrate, and 907 and 908 indicate interlayer insulating films.

The present inventor has recognized as follows. The technology described in Japanese Laid-Open Patent Publication 2005-57186, however, has the following problems.

When a current flows between the current flow-in terminal 902 and the current flow-out terminal 901, electrons flow into the pair of fused via portions 903 and 904 in different directions relative to the up-down direction of the vias. Thus, in the case where the direction in which electrons flow in is different, the cut state is different between the fused via portions 903 and 904, and therefore there may be inconsistency in the resistance value after the fuses are cut.

In the case where a fused via portion 903 or 904 is cut through electromigration, for example, a void B is created in the fused via portion 904 in the vicinity of the electrode pad 905 when one fused via portion 904 is cut, as shown in FIG. 6A. This void B is created so that the conductor forming the electrode pad 905 would not move toward the fused via portion 904 because the electrode pad 905 is covered with a barrier metal (not shown), and thus the electrode pad 905 itself is not cut, and the conductor forming the fused via portion 904 is pushed.

In the case where the other fused via portion 903 is cut, as shown in FIG. 6B, a void B is created in the electrode pad 905 in the vicinity of the fused via portion 903.

Thus, the cut state may be different between the fused via portions 903 and 904, and in addition the ease of cutting is different, and therefore there may be inconsistency in the resistance value after the fuses are cut.

Here, there is inconsistency in the resistance value after the fuses are cut due to the difference in the direction in which electrons flow, not only in the case where the vias are fused through electromigration, but also in the case where the vias are cut in accordance with a so-called "crack assist method".

SUMMARY

In one embodiment, there is provided a semiconductor device having: a substrate; and a first electrical fuse and a second electrical fuse provided on the substrate, wherein the first electrical fuse has: a first upper layer wire and a first lower layer wire formed in different wire layers; and a via for connecting the first upper layer and the first lower layer wire, the second electrical fuse has: a second upper layer wire and a second lower layer wire formed in different wire layers; and a via for connecting the second upper layer and the second lower layer wire, the semiconductor device includes a connection portion for connecting the first upper layer wire of the first electrical fuse to the second lower layer wire of the second electrical fuse, and the first electrical fuse and the second electrical fuse are connected in series via the connection portion.

Here, the connection portion for connecting the first electrical fuse to the second electrical fuse is a portion which does not function as a fuse, and thus not cut when the fuse is cut.

According to this invention, the connection portion connects the first electrical fuse and the second electrical fuse in series, and therefore the direction in which electrons flow through the first electrical fuse and the second electrical fuse can be the same.

As described above, in the case where electrons flow through the first electrical fuse and the second electrical fuse in different directions, the cut state may be different, due to the effects of the flow of electrons between the first electrical fuse and the second electrical fuse, and thus there may be inconsistency in the resistance value after the fuses are cut.

In contrast, according to the present invention, the direction in which electrons flow through the first electrical fuse and the second electrical fuse is the same, and therefore the cut state is the same between the first electrical fuse and the second electrical fuse, and the ease of cutting can also be approximately the same between the first electrical fuse and the second electrical fuse.

As a result, inconsistency in the resistance value can be prevented between a state where the first electrical fuse is cut and a state where the second electrical fuse is cut. As a result, a highly reliable semiconductor device can be provided.

According to the present invention, only one of the first electrical fuse and the second electrical fuse may be cut, or both the first electrical fuse and the second electrical fuse may be cut. Thus, two electrical fused are provided, so that at least one of the two can be cut, and thus the reliability of the semiconductor device is higher.

The present invention provides a highly reliable semiconductor device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In the following, the embodiments of the present invention are described in reference to the drawings. Here, the same symbols are attached to components which are the same in all of the drawings, and the descriptions thereof are not repeated.

First Embodiment

Figure 1:
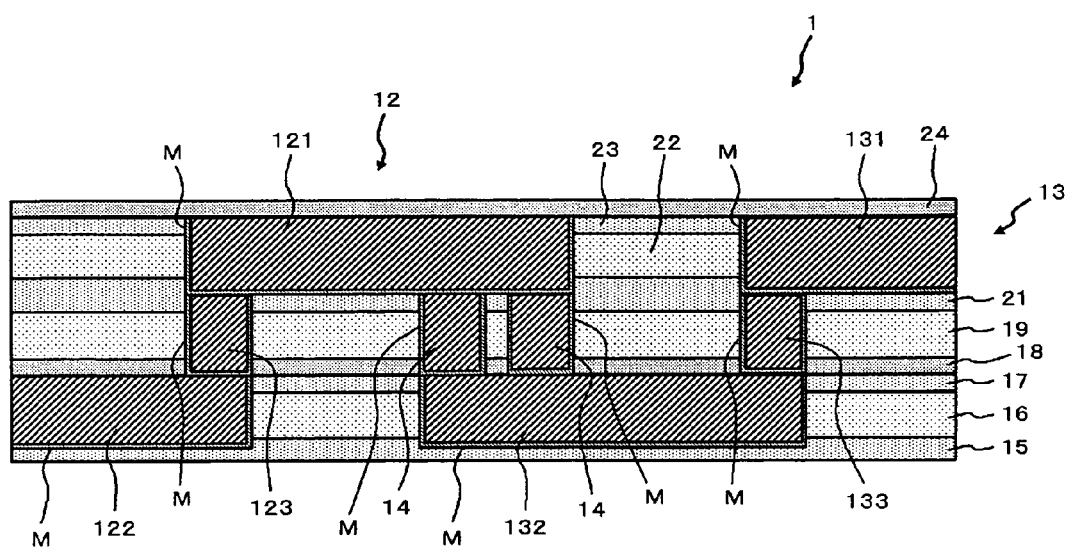
FIG. 1 is a cross sectional diagram showing the semiconductor device according to the first embodiment of the present invention.

FIG. 1 is a cross sectional diagram showing a semiconductor device 1 according to the present embodiment.

The semiconductor device 1 according to the present embodiment is provided with a substrate (for example a semiconductor substrate) (not shown), and a first electrical fuse 12 and a second electrical fuse 13, which are provided on the semiconductor substrate.

The first electrical fuse 12 has a first upper layer wire 121 and a first lower layer wire 122 formed in different wire layers, and a via 123 for connecting the first upper layer wire 121 to the first lower layer wire 122.

The second electrical fuse 13 has a second upper layer wire 131 and a second lower layer wire 132 formed in different wire layers, and a via 133 for connecting the second upper layer wire 131 to the second lower layer wire 132.

Furthermore, the semiconductor device 1 according to the present embodiment has a connection portion 14 for connecting the first upper layer wire 121 of the first electrical fuse 12 to the second lower layer wire 132 of the second electrical fuse 13.

This connection portion 14 connects the first electrical fuse 12 and the second electrical fuse 13 in series.

In the following, the semiconductor device 1 according to the present embodiment is described in detail.

The semiconductor device 1 has a first etching prevention film 15, a first interlayer insulating film 16, a first protection film 17, a second etching prevention film 18, a second interlayer insulating film 19, a third etching prevention film 21, a third interlayer insulating film 22, a second protection film 23 and a fourth etching prevention film 24, which are formed on the semiconductor substrate in this order, in addition to the above described first electrical fuse 12, second electrical fuse 13 and connection portion 14.

The first interlayer insulating film 16 and the third interlayer insulating film 22 may have a low dielectric constant, and may be of SiOC, for example. As the film having a low dielectric constant, polyhydrogen siloxanes, such as HSQ (hydrogen silsesquioxane), MSQ (methyl silsesquioxane) and MHSQ (methylated hydrogen silsesquioxane), organic materials containing an aromatic group, such as polyaryl ether (PAE), divinyl siloxane bis-benzocyclobutane (BCB) and Silk (registered trademark), and SOG, FOX (flowable oxide), Cytop and BCB (bensocyclobutene) can be used. In addition, porous films of these can also be used as the film having a low dielectric constant. The first interlayer insulating film 16 and the third interlayer insulating film 22 may be formed of the same or different materials.

In addition, the second interlayer insulating film 19 may be formed of the same material as that described above for the first interlayer insulating film 16 and the third interlayer insulating film 22. Here, it is preferable for the second interlayer insulating film 19 to be formed of a harder material than the first interlayer insulating film 16 and the third interlayer insulating film 22. The second interlayer insulating film 19 may be formed of a material having a higher Young's modulus than the first interlayer insulating film 16 and the third interlayer insulating film 22. Though the details are described later, this configuration makes it easy to form a flow-out portion 20 in the wire portion (see FIG. 2).

Here, the configuration is not limited to this, and the second interlayer insulating film 19 may be formed of the same material as the first interlayer insulating film 16 and the third interlayer insulating film 22.

The second etching prevention film 18 and the fourth etching prevention film 24 function as etching prevention films when via holes and wire trenches are created, and at the same time, function to the prevent copper for forming the lower layer wires 122 and 132 and the upper layer wires 121 and 131 from diffusing. In addition, they function as a coating film for the electrical fuses 12 and 13 in the present embodiment.

The second etching prevention film 18 and the fourth etching prevention film 24 may be formed of a harder material than the first interlayer insulating film 16 and the third interlayer insulating film 22. The second etching prevention film 18 and the fourth etching prevention film 24 may be formed of a material having a higher Young's modulus than the first interlayer insulating film 16 and the third interlayer insulating film 22. The second etching prevention film 18 and the fourth etching prevention film 24 can be formed of SiCN, SiN, SiC, SiOF or SiON, for example.

The first protection film 17 and the second protection film 23 function to protect the first interlayer insulating film 16 and the third interlayer insulating film 22 when the lower layer wires 122 and 132 and the upper layer wires 121 and 131 are polished through CMP. The first protection film 17 and the second protection film 23 may be formed of an $SiO_2$ film, for example.

The first etching prevention film 15 and the third etching prevention film 21 may be formed of the same material as the second etching prevention film 18 and the fourth etching prevention film 24. In addition, though not shown, the first etching prevention film 15 and the third etching prevention film 21 may be multilayer films of a first insulating film made of the same material as the second etching prevention film 18 and the fourth etching prevention film 24, and a second insulating film made on top of this of the same material as the first protection film 17 and the second protection film 23.

The first lower layer wire 122 of the first electrical fuse 12 is formed so as to extend through the first etching prevention film 15, the first interlayer insulating film 16 and the first protection film 17, as described above.

In addition, the first upper layer wire 121 is formed so as to extend through the third etching prevention film 21, the third interlayer insulating film 22 and the second protection film 23.

The via 123 is provided so as to penetrate through the second etching prevention film 18, the second interlayer insulating film 19 and the third etching prevention film 21, and connects an end portion of the first lower layer wire 122 to an end portion of the first upper layer wire 121.

The second lower layer wire 132 of the second electrical fuse 13 is provided in the same wire layer as the first lower layer wire 122 of the first electrical fuse 12 and, concretely, formed so as to extend through the first etching prevention film 15, the first interlayer insulating film 16 and the first protection film 17.

The second upper layer wire 131 of the second electrical fuse 13 is also provided in the same wire layer as the first upper layer wire 121 of the first electrical fuse 12, and formed so as to extend through the third etching prevention film 21, the third interlayer insulating film 22 and the second protection film 23.

The via 133 is provided so as to penetrate through the second etching prevention film 18, the second interlayer insulating film 19 and the third etching prevention film 21, like the via 123, and connects an end portion of the second lower layer wire 132 to an end portion of the second upper layer wire 131.

In addition, the diameter of the via 133 is equal to that of the via 123.

The connection portion 14 connects the first upper layer wire 121 of the first electrical fuse 12 to the second lower layer wire 132 of the second electrical fuse 13, and is provided so as to penetrate through the second etching prevention film 18, the second interlayer insulating film 19 and the third etching prevention film 21, like the vias 123 and 133. The connection portion 14 in the present embodiment is a via.

This connection portion 14 connects an end portion of the first upper layer wire 121 of the first electrical fuse 12 to an end portion of the above described second lower layer wire 132 of the above described second electrical fuse 13.

A plurality of connection portions 14 (for example two) are provided in the present embodiment. The size and form of each connection portion 14 are the same as those of the vias 123 and 133. That is to say, the cross sectional area of each connection portion 14 in a direction perpendicular to the flow of the current is the same as the cross sectional area of the vias 123 and 133 in a direction perpendicular to the flow of the current.

Here, the first etching prevention film 15 and the third etching prevention film 21 may be omitted, depending on the process. In addition, the first interlayer insulating film 16, the second interlayer insulating film 19 and the third interlayer insulating film 22 each may be formed of an $SiO_2$ film or an F-doped $SiO_2$ film having a low dielectric constant instead of the above described films having a low dielectric constant.

The above described first electrical fuse 12, second electrical fuse 13 and connection portion 14 may be formed of a copper-containing metal film having copper as a main component, for example. The copper-containing metal film may contain silver. Furthermore, the copper-containing metal film may be formed to contain one or more different elements selected from among Al, Au, Pt, Cr, Mo, W, Mg, Be, Zn, Pd, Cd, Hg, Si, Zr, Ti and Sn. The copper-containing metal film may be formed in accordance with a plating method, for example. In addition, the structure may be such that a silicide film is formed on the surface of the copper-containing metal film.

Barrier metal films M are formed on the sides and bottom of the first upper layer wire 121, the first lower layer wire 122, the second upper layer wire 131, the second lower layer wire 132, the vias 123 and 133, and the connection portions 14 so as to cover and make contact with these. The barrier metal films may be formed so as to contain a high melt point metal, for example Ta, TaN, Ti, TiN, W or WN.

The first electrical fuse 12, the second electrical fuse 13 and the connection portions 14 having the above described structure may be formed in the same process as conventional multilayer wire structures, that is to say, in accordance with a single damascene method. As a result, the first electrical fuse 12, the second electrical fuse 13 and the connection portions 14 can be formed without adding any special process.

Concretely, first the first etching prevention film 15, the first interlayer insulating film 16 and the first protection film 17 are formed on a semiconductor substrate.

Next, a trench for the first lower layer wire 122 and the second lower layer wire 132 is created. Next, a barrier metal film M is formed within the above described trench and on the first protection film 17, and furthermore, a conductor film for forming the first lower layer wire 122 and the second lower layer wire 132 is formed.

After that, the barrier metal film and the conductor film are removed through CMP, so that the first lower layer wire 122 and the second lower layer wire 132 are formed.

Next, the second etching prevention film 18, the second interlayer insulating film 19 and the third etching prevention film 21 are formed, and the vias 123 and 133 and holes for connection portions 14 are created.

Next, a barrier metal film is formed within the above described holes and on the third etching prevention film 21, and furthermore, a conductor film for forming the vias 123 and 133 and the connection portions 14 is formed.

After that, the barrier metal film M and the conductor film are removed through CMP, so that the vias 123 and 133 and the connection portion 14 are formed.

Furthermore, the third interlayer insulating film 22 and the second protection film 23 are formed, and a trench for the first upper layer wire 121 and the second upper layer wire 131 is created.

Next, a barrier metal film M is formed within the above described trench and on the second protection film 23, and furthermore, a conductor film for forming the first upper layer wire 121 and the second upper layer wire 131 is formed.

After that, the barrier metal film M and the conductor film are removed through CMP, so that the first upper layer wire 121 and the second upper layer wire 131 are formed.

Next, a method for cutting the first electrical fuse 12 and the second electrical fuse 13 is described.

A voltage is applied between the terminal (not shown) connected to the first lower layer wire 122 of the first electrical fuse 12 and the terminal (not shown) connected to the second upper layer wire 131 of the second electrical fuse 13.

As a result, the current flows from the first lower layer wire 122 through the via 123, the first upper layer wire 121, the connection portion 14, the second lower layer wire 132, the via 133 and the second upper layer wire 131 in this order. Here, electrons flow in the direction opposite to the current.

At this time, the first electrical fuse 12 and the second electrical fuse 13 are connected in series by means of the connection portion 14, and therefore the current flows from the lower layer wire toward the upper layer wire, and the direction in which the current flows through the respective fuses is the same.

When a current exceeding a predetermined current value flows between the terminals, the first lower layer wire 122, the via 123 and the second upper layer wire 121 of the first electrical fuse 12 and the second lower layer wire 132, the via 133 and the second upper layer wire 131 of the second electrical fuse 13 are heated, and thus the first electrical fuse 12 and the second electrical fuse 13 expand.

Thus, the barrier metal films M that form the first electrical fuse 12 and the second electrical fuse 13 and the surrounding insulating films crack.

Figure 2:
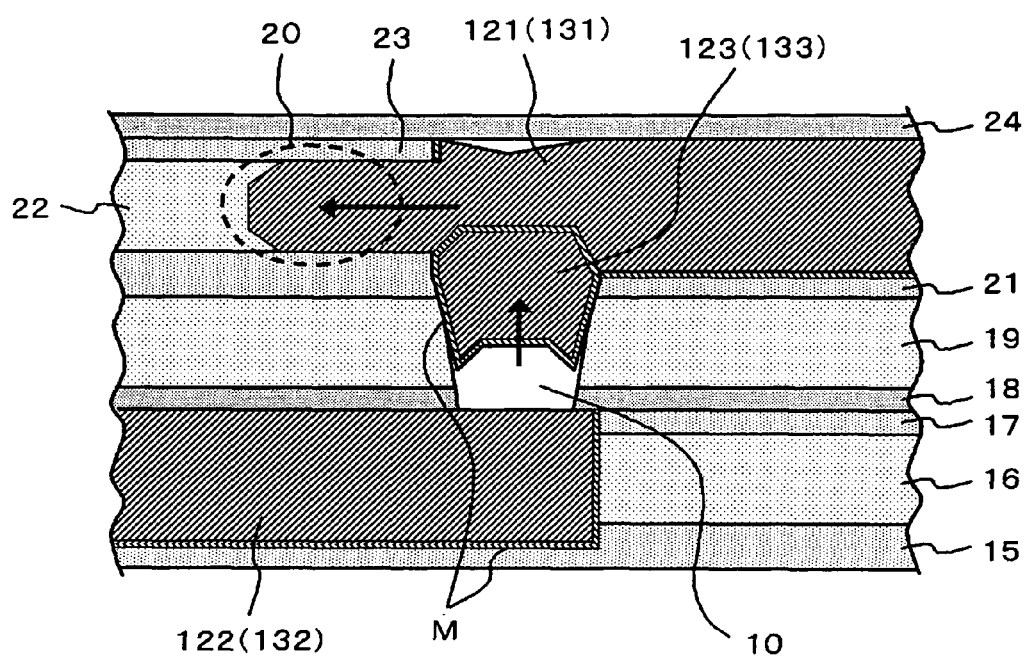
FIG. 2 is a cross sectional diagram showing how an electrical fuse is cut.

Concretely, as shown in FIG. 2, a portion having a large volume, for example a conductor that forms the upper layer wire of at least one of the electrical fuses among the first electrical fuse 12 or the second electrical fuse 13 expands. And the conductor that forms the upper layer expands in the direction of the third interlayer insulating film 22, which is a soft film. As the conductor expands, the barrier metal films M crack, and the conductor that forms the upper layer wire 121 (131) flows out into the third interlayer insulating film 32 through the cracks. That is to say, the conductor that forms the upper layer wire 121 (131) flows out into a portion outside the wire trench. As a result, a flow-out portion 20 is formed, and the density of the conductor that forms the electrical fuse 12 (13) lowers.

Furthermore, the conductor suddenly moves in the direction of the flow-out portion 20, and therefore the conductor is cut in such a location as not to follow the movement. In the present embodiment, the conductor is cut in the via 123 (133) and a space 10 is created. This mechanism allows a large space 10 to be created in a location at a certain distance from the flow-out portion 20.

At this time, though a predetermined current flows through the connection portion 14, a plurality of connection portions 14 are provided in the present embodiment, and therefore the current that flows through the respective connection portions 14 is weaker than in the first electrical fuse 12 and the second electrical fuse 13. Therefore, the connection portion 14 is difficult to heat and the connection portion 14 is not cut.

Here, when the upper layer wire 121 (131) is heated and expands, the fourth etching prevention film 24 sometimes peels from the upper layer wire 121 (131) and the second protection film 23, so that a space is created between the two. In this case, the conductor that forms the upper layer wire 121 (131) flows into the space, so that a flow-out portion is formed. In this case also, the conductor moves in the direction of the flow-out portion, and thus the via 123 (133) is cut.

Next, the working effects of the present embodiment are described.

In the present embodiment, the connection portion 14 connects the first electrical fuse 12 and the second electrical fuse 13 in series, and therefore electrons flow through the first electrical fuse 12 and the second electrical fuse 13 in the same direction.

In the case where electrons flow through the first electrical fuse and the second electrical fuse in different directions, the cut state is different between the first electrical fuse and the second electrical fuse, due to the difference in the flow of electrons, and thus there may be inconsistency in the resistance value after the fuses are cut.

In contrast, electrons flow through the first electrical fuse 12 and the second electrical fuse 13 in the same direction in the present embodiment, and therefore the cut state is the same between the first electrical fuse 12 and the second electrical fuse 13, and at the same time, the ease of cutting is also almost the same between the first electrical fuse 12 and the second electrical fuse 13.

As a result, inconsistency in the resistance value can be prevented between a state where the first electrical fuse 12 is cut and a state where the second electrical fuse 13 is cut. Thus, a highly reliable semiconductor device 1 can be provided.

Here, though the section of RELATED ART gives an example where an electrical fuse is cut through electromigration, it is possible that there may be inconsistency in the resistance value due to the difference in the direction in which electrons flow in the case where electrical fuses are cut in accordance with a crack assist method, as in the present embodiment. Accordingly, it is effective for electrons to flow through the first electrical fuse 12 and the second electrical fuse 13 in the same direction, as in the present embodiment, also in the case where electrical fuses are cut through crack assistance.

In addition, in the present embodiment, a plurality of connection portions 14 are provided. As a result, the current that flows through the respective connection portions 14 can be reduced. Though the diameter of the respective connection portions 14 is equal to the diameter of the via 123 of the first electrical fuse 12 and the diameter of the via 133 of the second electrical fuse 13, the current that flows through the connection portions 14 is weaker than in the vias 123 and 133 when a plurality of connection portions 14 are provided. As a result, the connection portions 14 are difficult to heat, and thus the connection portions 14 can be prevented from being cut, and a space can be prevented from being created between the connection portions 14 and the first upper layer wire 121, or between the connection portions 14 and the second lower layer wire 132.

In conventional electrical fuses, electrons flow through a pair of electrical fuses in different directions, and therefore there may be a great difference in the ease of cutting between the electrical fuses. In this case, only one electrical fuse is easy to cut, and only the one that is easy to cut must be cut without failure, and thus only one electrical fuse becomes the object to be cut, even when a plurality of electrical fuses are provided.

In contrast, electrons flow through a pair of electrical fuses 12 and 13 in the same direction in the present embodiment, and therefore there is no great difference in the ease of cutting between the electrical fuses 12 and 13. Accordingly, at least one of the pair of electrical fuses 12 and 13 may be cut.

Thus, in the present embodiment, a plurality of electrical fuses 12 and 13 that are equally easy to cut are provided, and therefore it becomes possible to cut the electrical fuse 12 or 13 without failure, and the semiconductor device 1 is highly reliable.

In addition, in the case where the first electrical fuse 12 and the second electrical fuse 13 are both cut, even when one of the two is reconnected during heat treatment or the like on the semiconductor device 1, the other is not reconnected, and thus the semiconductor device 1 is highly reliable.

Furthermore, barrier metal films M are provided between the via 123 and the first lower layer wire 122, as well as between the via 133 and the second lower layer wire 132 in the present embodiment, and therefore the barrier metal films M easily peel from the lower layer wires 122 and 132, and thus a space 10 is easily created between the barrier metal film M and the lower layer wire 122 and 132.

In addition, in the present embodiment, the space 10 and the flow-out portion 20 are in different regions, and therefore the electrical fuses 12 and 13 can be prevented from being reconnected without failure.

Furthermore, the via 123 in the first electrical fuse 12 connects an end portion of the first lower layer wire 122 to an end portion of the first upper layer wire 121 in the present embodiment.

Likewise, the via 133 in the second electrical fuse 13 connects an end portion of the second lower layer wire 132 to an end portion of the second upper layer wire 131.

Thus, when the vias 123 and 133 are connected to the end portions of the upper layer wires 121 and 131, the conductor that forms the vias 123 and 133 easily flows toward the end portions of the upper layer wires 121 and 131, and make it easy for the flow-out portion 20 to be formed on the third interlayer insulating film 22, which is a soft film.

In addition, the connection portions 14 are formed of vias in the present embodiment, and an end portion of the upper layer wire 121 of the first electrical fuse 12 and an end portion of the lower layer wire 132 of the second electrical fuse 13 overlap as viewed from the substrate surface side. In this configuration, the area occupied by the electrical fuses 12 and 13 on the surface of the substrate can be made small.

Second Embodiment

Figure 3:
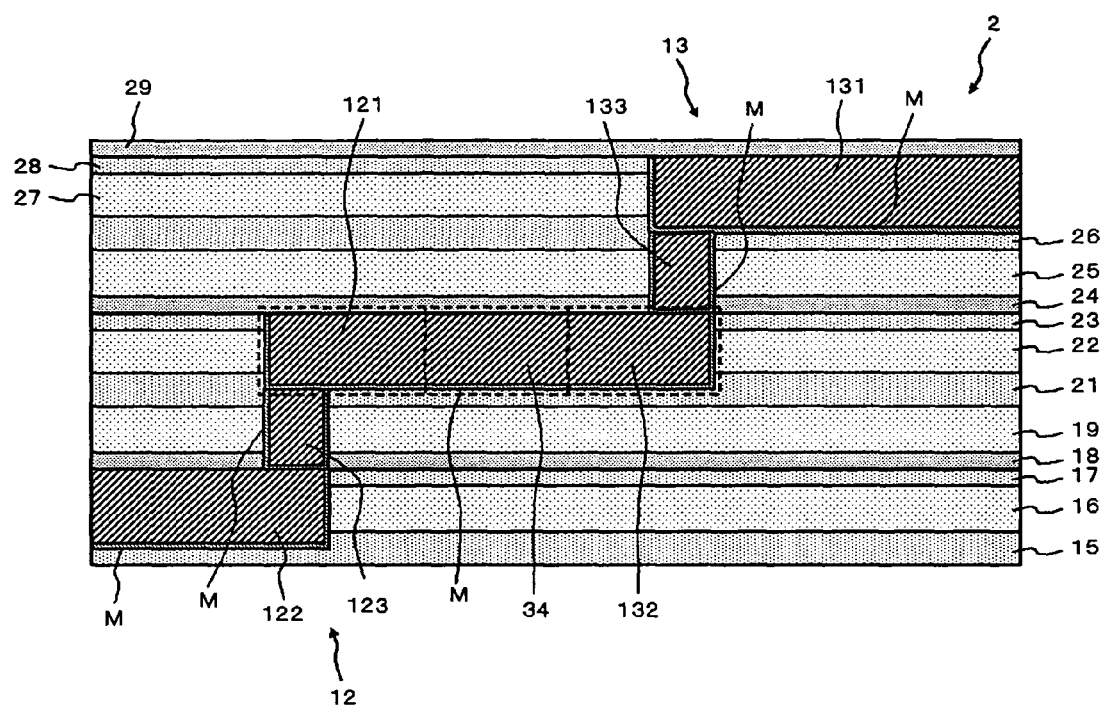
FIG. 3 is a cross sectional diagram showing the semiconductor device according to the second embodiment of the present invention.

The semiconductor device 2 according to the present embodiment is described in reference to FIG. 3.

The first electrical fuse 12 and the second electrical fuse 13 are formed in the same wire layer in the above described embodiment.

In contrast, in the present embodiment, the first electrical fuse 12 and the second electrical fuse 13 are formed in different wire layers.

Furthermore, the connection portions 14 are made of vias in the above described embodiment, while the connection portions are wires 34 for connecting the first upper layer wire 121 of the first electrical fuse 12 to the second lower layer wire 132 of the second electrical fuse 13, which is formed in the same wire layer as the first upper layer wire 121 and the second lower layer wire 132.

The rest is the same as in the above described embodiment.

In the following, the semiconductor device 2 according to the present embodiment is described in detail.

In the present embodiment, the semiconductor device 2 has a fourth interlayer insulating film 25 formed on the fourth etching prevention film 24, a fifth etching prevention film 26, a fifth interlayer insulating film 27, a third protection film 28 and a sixth etching prevention film 29.

The fourth interlayer insulating film 25 can be formed of the same material as the second interlayer insulating film 19.

In addition, the fifth etching prevention film 26 may be formed of the same material as the third etching prevention film 21, the fifth interlayer insulating film 27 may be formed of the same material as the third interlayer insulating film 22, the third protection film 28 may be formed of the same material as the second protection film 23, and the sixth etching prevention film 29 may be formed of the same material as the fourth etching prevention film 24.

The connection portion 34 connects the first upper layer 121 to the second lower layer wire 132, and is formed of the same material as the first upper layer wire 121 and the second lower layer wire 132. In addition, the thickness and width are the same as for the first upper layer wire 121 and the second lower layer wire 132.

That is to say, in the present embodiment, the first upper layer wire 121, the second lower layer wire 132 and the connection portion 34 are formed of the same wire.

Here, the width of the connection portion 14 may be greater than the width of the first upper layer wire 121 and the second lower layer wire 132.

In the present embodiment, the same effects can be gained as in the first embodiment.

Here, in FIG. 3, the first upper layer wire 121, the connection portion 34 and the second lower layer wire 132 are separate, so that the invention can be easily understood.

The present invention is not limited to the above described embodiments, and modifications and variations within such a scope that the object of the present invention can be achieved are included in the present invention.

For example, though a plurality of connection portions 14 are provided in the first embodiment, the invention is not limited to this, and the diameter of the connection portions may be greater than that of the vias 123 and 133, and the cross section of the connection portions perpendicular to the direction in which the current flows may be greater than the cross section of the vias 123 and 133 perpendicular to the direction in which a current flows.

Thus, the connection portions can be prevented from being cut without failure.

Furthermore, the material for forming the connection portions may have a lower resistance value than the material for forming the vias 123 and 133. Thus, the connection portions become difficult to heat when a current flows through the connection portions, and the connection portions can be prevented from being cut.

Figure 4:
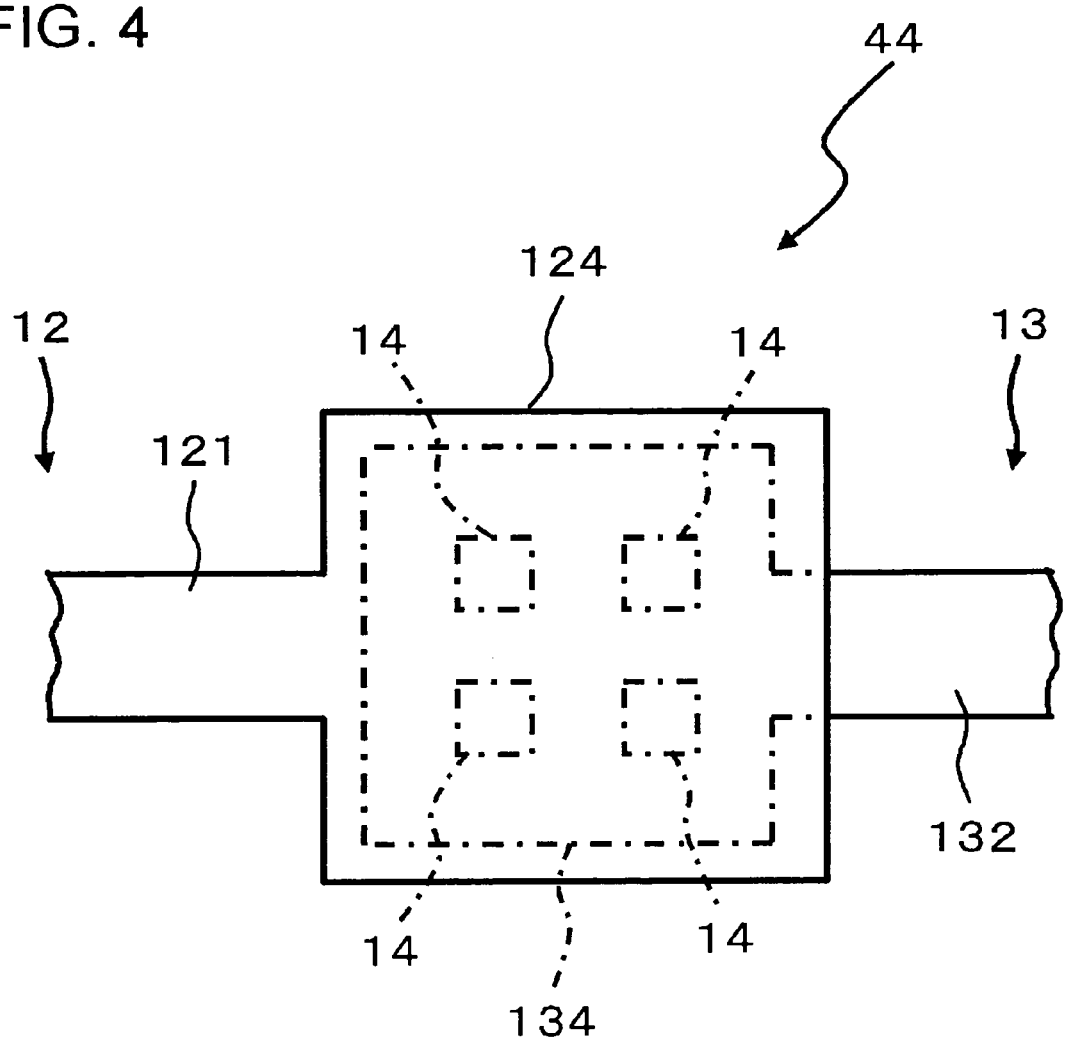
FIG. 4 is a plan diagram showing part of the semiconductor device according to a modification of the present invention.
Figure 5:
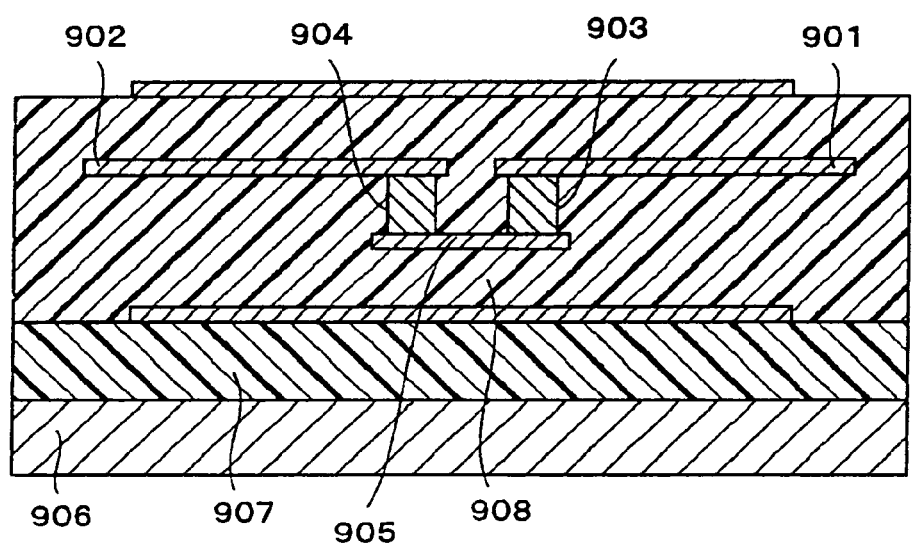
FIG. 5 is a cross sectional diagram showing a conventional semiconductor device.
Figure 6A:
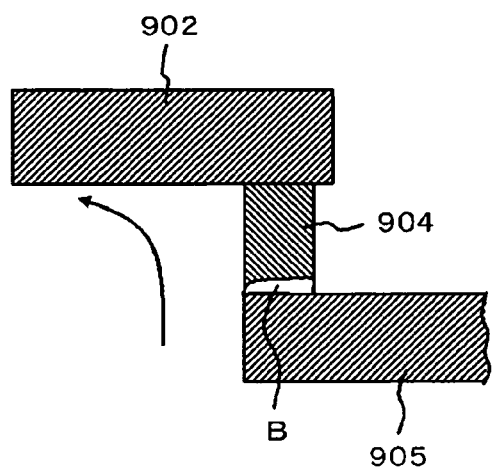
FIGS. 6A and 6B are diagrams showing an electrical fuse in a conventional semiconductor device in a cut state.
Figure 6B:
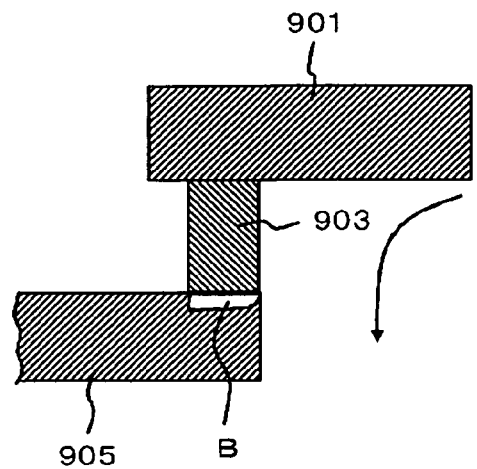

In addition, the connection 44 shown in FIG. 4, may be formed. FIG. 4 is a plan diagram showing an electrical fuse as viewed from the substrate side. Concretely, pad portions 124 and 134 having a greater area than the upper layer wire 121 and the lower layer wire 132 are formed in an end portion of upper layer wire 121 of the first electrical fuse 12 and in an end portion of the lower layer wire 132 of the second electrical fuse 13.

Thus, there may be connection between these pad portions with a plurality of vias 14. Thus, the heat release properties in the connection portion can be enhanced, and the via 14 can be prevented from being cut without failure.

Furthermore, though in the above described embodiments, the first electrical fuse 12, the second electrical fuse 13 and the connection portions 14 and 34 are formed in accordance with a single damascene method, the invention is not limited to this, and they may be formed in accordance with dual damascene method.

Though in the above described embodiments, two electrical fuses 12 and 13 are connected in series, the invention is not limited to this, and three or more electrical fuses may be connected in series.

In addition, though in the above described embodiments, the first electrical fuse 12 and the second electrical fuse 13 are cut in accordance with a crack assist method, the invention is not limited to this, and they may be cut in accordance with an electromigration method.

Whether the fuses are cut in accordance with a crack assist method or in accordance with an electromigration method can be determined by selecting the material for the electrical fuses, the method for applying a current or a voltage to the electrical fuses, the material for the interlayer insulating films and the like.

It is apparent that the present invention is not limited to the above embodiments, and may be modified and changed without departing from the scope and spirit of the invention.

What is claimed is:

1. A semiconductor device, comprising:
   a substrate; and
   a first electrical fuse and a second electrical fuse provided over said substrate, wherein said first electrical fuse comprises:
   a first upper layer wire and a first lower layer wire formed in different wire layers; and
   a via for connecting said first upper layer wire and said first lower layer wire, wherein said second electrical fuse comprises:
   a second upper layer wire and a second lower layer wire formed in different wire layers; and
   a via for connecting said second upper layer wire and said second lower layer wire, wherein the semiconductor device comprises a connection portion, formed in an intermediate layer disposed between the first upper layer wire and the second lower layer wire, for connecting said first upper layer wire of said first electrical fuse to said second lower layer wire of said second electrical fuse, and wherein said first electrical fuse and said second electrical fuse are connected in series via said connection portion.

2. The semiconductor device according to claim 1, wherein said connection portion comprises a via for connecting said first upper layer wire of said first electrical fuse to said second lower layer wire of said second electrical fuse.

3. The semiconductor device according to claim 1, wherein said first lower layer wire of said first electrical fuse and said second lower layer wire of said second electrical fuse are provided in a same wire layer, and wherein said first upper layer wire of said first electrical fuse and said second upper layer wire of said second electrical fuse are provided in a same wire layer.

4. The semiconductor device according to claim 2, wherein a plurality of vias, as said connection portion, are provided.

5. The semiconductor device according to claim 2, wherein the vias of said first electrical fuse and said second electrical fuse have a same diameter.

6. The semiconductor device according to claim 5, wherein a diameter of the via of said connection portion is greater than the diameter of the vias of said first electrical fuse and said second electrical fuse.

7. The semiconductor device according to claim 1, wherein a flow-out portion which flows out is formed in one of said first upper layer wire and said first lower layer wire, and a space is created between an other of said first upper layer wire and said first lower layer wire and the via of said first electrical fuse, or in the via of said first electrical fuse, when said first electrical fuse is cut, and wherein a flow-out portion which flows out is formed in one of said second upper layer wire and said second lower layer wire, and a space is created between an other of said second upper layer wire and said second lower layer wire and the via of said second electrical fuse, or in the via of said second electrical fuse, when said second electrical fuse is cut.

8. The semiconductor device according to claim 7, wherein the via of said first electrical fuse connects an end portion of said first upper layer wire to an end portion of said first lower layer wire, and wherein the via of said second electrical fuse connects an end portion of said second upper layer wire to an end portion of said second lower layer wire.

9. The semiconductor device according to claim 1, wherein said connection portion abuts an upper surface of the second lower layer wire.

10. The semiconductor device according to claim 1, wherein, in a plan view, said connection portion overlaps with the first upper layer wire and the second lower layer wire.

11. The semiconductor device according to claim 1, further comprising:
an interlayer insulating film that abuts side surfaces of the first upper layer wire and the second upper layer wire.

12. The semiconductor device according to claim 11, further comprising:

another interlayer insulating film that abuts side surfaces of the first lower layer wire and the second lower layer wire.

13. The semiconductor device according to claim 1, wherein the first lower layer wire is connected in series to the second lower layer wire through said connection portion.

14. The semiconductor device according to claim 1, wherein the via of said first electrical fuse abuts a bottom surface of the first upper layer wire.

15. The semiconductor device according to claim 1, further comprising:
an etching prevention film formed on a surface of the second lower layer wire;
an interlayer insulating film formed on an upper surface of the etching prevention film; and
another etching prevention film formed on an upper surface of the interlayer insulating film,
wherein said connection portion is penetrated through said etching prevention film, said interlayer insulating film, and said another etching prevention film.

16. The semiconductor device according to claim 1, wherein, when a voltage is applied between the first lower layer wire and the second upper layer wire, a current flows from the first lower layer wire through the via of said first electrical fuse, the first upper layer wire, the connection portion, the second lower layer wire, the via of said second electrical fuse, and the second upper layer wire, in that order.

17. The semiconductor device according to claim 1, wherein a plurality of ones of the connection portion abuts the lower surface of the first upper layer wire and an upper surface of the second lower layer wire.

18. The semiconductor device according to claim 1, wherein said connection portion abuts a bottom surface of the first upper layer wire.

19. The semiconductor device according to claim 1, wherein the via of said first electrical fuse is directly connected to said first upper layer wire and said first lower layer wire, and the via of said second electrical fuse is directly connected to said second upper layer wire and said second lower layer wire.

20. A semiconductor device, comprising:
a first layer comprising a first lower layer wire and a second lower layer wire;
a second layer comprising a first upper layer wire and a second upper layer wire; and
an intermediate layer disposed over an upper surface of the first layer and below a bottom surface of the second layer, said intermediate layer comprising:
a via connecting said first upper layer wire and said first lower layer wire;
a connection portion connecting said first upper layer wire and said second lower layer wire; and
another via connecting said second upper layer wire and said second lower layer wire,
wherein the connection portion and said via abut a bottom surface of the first upper layer wire, and
wherein said another via abuts a bottom surface of the second upper layer wire and an timer surface of the second lower layer wire such that the first lower layer wire is connected in series to the second lower layer wire through said connection portion.

* * * * *